(12) United States Patent
Moore et al.

(10) Patent No.: US 6,884,725 B2
(45) Date of Patent: Apr. 26, 2005

(54) METHODS OF FORMING MATERIALS WITHIN OPENINGS, AND METHODS OF FORMING ISOLATION REGIONS

(75) Inventors: John T. Moore, Boise, ID (US); Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 10/145,562

(22) Filed: May 14, 2002

(65) Prior Publication Data

US 2002/0132483 A1 Sep. 19, 2002

Related U.S. Application Data

(63) Continuation of application No. 09/910,340, filed on Jul. 20, 2001, now Pat. No. 6,420,268, which is a continuation of application No. 09/146,730, filed on Sep. 3, 1998, now Pat. No. 6,274,498.

(51) Int. Cl.[7] .............................................. H01L 21/461
(52) U.S. Cl. ....................... 438/692; 438/700; 438/723; 438/724
(58) Field of Search ................................ 438/424–428, 438/692, 700, 706, 695, 723, 724, 756, 757

(56) References Cited

U.S. PATENT DOCUMENTS

| 4,533,430 A |   | 8/1985 | Bower ......................... 156/643 |
| 4,534,826 A | * | 8/1985 | Goth et al. .................. 438/421 |
| 4,663,832 A |   | 5/1987 | Jambotkar .................... 29/576 |
| 4,882,291 A |   | 11/1989 | Jeuch ........................... 437/34 |

(Continued)

FOREIGN PATENT DOCUMENTS

| EP | 0 782 185 A2 | 7/1997 |
| JP | 11-67890 | 9/1999 |
| JP | 2000-269318 | 9/2000 |

OTHER PUBLICATIONS

S. Wolf et al, Silicon Processing for the VLSI Era, vol. 1, p. 366, 1986.
Chatterjee, A., et al., A Study of Integration Issues in SHallow Trench Isolation for Deep Submicron CMOS Technologies, SPIE vol. 2875, Aug. 1996, pp. 39–43.
S. Wolfe et al, Silicon Processing for the VLSI Era, vol. 1, pps. 522, 534, 541, 1986.

(Continued)

*Primary Examiner*—Nadine G. Norton
*Assistant Examiner*—Duy-Vu Deo
(74) *Attorney, Agent, or Firm*—Wells St. John P.S.

(57) ABSTRACT

In one aspect, the invention includes a method of forming a material within an opening, comprising: a) forming an etch-stop layer over a substrate, the etch-stop layer having an opening extending therethrough to expose a portion of the underlying substrate and comprising an upper corner at a periphery of the opening, the upper corner having a corner angle with a first degree of sharpness; b) reducing the sharpness of the corner angle to a second degree; c) after reducing the sharpness, forming a layer of material within the opening and over the etch-stop layer; and d) planarizing the material with a method selective for the material relative to the etch-stop layer to remove the material from over the etch-stop layer while leaving the material within the opening.

13 Claims, 7 Drawing Sheets

U.S. PATENT DOCUMENTS

| | | | |
|---|---|---|---|
| 5,258,332 A | 11/1993 | Horioka et al. | 437/228 |
| 5,356,828 A | 10/1994 | Swan et al. | 437/67 |
| 5,374,585 A | 12/1994 | Smith et al. | 438/443 |
| 5,397,733 A | 3/1995 | Jang | 437/69 |
| 5,399,520 A | 3/1995 | Jang | 457/67 |
| 5,506,168 A | 4/1996 | Morita et al. | 437/67 |
| 5,554,256 A | 9/1996 | Pruijmboom et al. | 156/643.1 |
| 5,578,518 A | 11/1996 | Koike et al. | 437/67 |
| 5,674,775 A | 10/1997 | Ho et al. | 438/296 |
| 5,677,233 A | 10/1997 | Abiko | 438/67 |
| 5,712,185 A | 1/1998 | Tsai et al. | 437/67 |
| 5,728,620 A | 3/1998 | Park | 438/425 |
| 5,780,346 A | 7/1998 | Arghavani et al. | 438/296 |
| 5,801,083 A | 9/1998 | Yu et al. | 438/424 |
| 5,817,566 A * | 10/1998 | Jang et al. | 438/424 |
| 5,834,358 A | 11/1998 | Pan et al. | 438/424 |
| 5,843,846 A * | 12/1998 | Nguyen et al. | 438/713 |
| 5,858,865 A | 1/1999 | Juengling et al. | 438/585 |
| 5,863,827 A | 1/1999 | Joyner | 438/425 |
| 5,880,004 A | 3/1999 | Ho | 438/421 |
| 5,895,254 A | 4/1999 | Huang et al. | 438/424 |
| 5,904,523 A * | 5/1999 | Feldman et al. | 438/263 |
| 5,904,538 A | 5/1999 | Son et al. | 438/424 |
| 5,925,575 A | 7/1999 | Tao et al. | 438/692 |
| 5,926,722 A * | 7/1999 | Jang et al. | 438/424 |
| 5,933,749 A | 8/1999 | Lee | 438/435 |
| 5,937,308 A | 8/1999 | Gardner et al. | 438/424 |
| 5,960,297 A | 9/1999 | Saki | 438/424 |
| 5,962,342 A | 10/1999 | Chuang et al. | 438/692 |
| 5,966,614 A | 10/1999 | Park et al. | 438/401 |
| 5,968,842 A * | 10/1999 | Hsiao | 438/692 |
| 5,976,948 A | 11/1999 | Werner et al. | 438/424 |
| 5,981,356 A | 11/1999 | Hsueh et al. | 438/424 |
| 5,989,975 A | 11/1999 | Kuo | 438/424 |
| 6,010,947 A | 1/2000 | Kondo | |
| 6,040,232 A | 3/2000 | Gau | 438/424 |
| 6,074,932 A | 6/2000 | Wu | 438/435 |
| 6,083,808 A | 7/2000 | Shin et al. | 438/435 |
| 6,090,683 A | 7/2000 | Torek | 438/424 |
| 6,090,684 A | 7/2000 | Ishitsuka et al. | 438/424 |
| 6,093,621 A | 7/2000 | Tseng | 438/424 |
| 6,100,160 A | 8/2000 | Hames | |
| 6,103,635 A | 8/2000 | Chau et al. | 438/739 |
| 6,121,113 A | 9/2000 | Takatsuka | 438/424 |
| 6,153,478 A | 11/2000 | Lin et al. | 438/296 |
| 6,153,480 A | 11/2000 | Arghavani et al. | 438/296 |
| 6,177,331 B1 | 1/2001 | Koga | 438/424 |
| 6,232,203 B1 | 5/2001 | Huang | 438/424 |
| 6,238,999 B1 | 5/2001 | Dickerson et al. | 438/424 |
| 6,245,640 B1 | 6/2001 | Claussen et al. | 438/424 |
| 6,245,684 B1 | 6/2001 | Zhao et al. | 438/704 |
| 6,249,035 B1 | 6/2001 | Peidous et al. | 257/506 |
| 6,274,498 B1 * | 8/2001 | Moore et al. | 438/692 |
| 6,284,623 B1 | 9/2001 | Zhang et al. | 438/424 |
| 6,284,625 B1 | 9/2001 | Ishitsuka et al. | 438/425 |
| 6,287,921 B1 | 9/2001 | Chern | 438/289 |

OTHER PUBLICATIONS

EP 0 782 185 A3 Search Report; Published Aug. 20, 1997; 2 pps.

"Optimized shallow trench isolation Structure and its process for eliminating shallow trench isolation–induced parasitic effects" IBM Technical Disclosure Bulletin; vol. 34, No. 11; Apr. 1992; pps. 276–277.

Ishimaru et al., "Trench Isolation Technology with 1 $\mu$m Depth–13 and p–wells for A Full–CMOS SRAM Cell with a 0.4 $\mu$m n+/p+ Spacing." © IEEE, pp. 97–98.

Fazan et al., "A Highly Manufacturable Trench Isolation Process for Deep Submicron DRAMS," © 1993 IEEE, pp. 57–60 (4 pages).

Wolf Ph.D. "Silicon Processing for the VLSI Ero, vol. 2: Process Integration," ©1990, pp. 51–54.

* cited by examiner

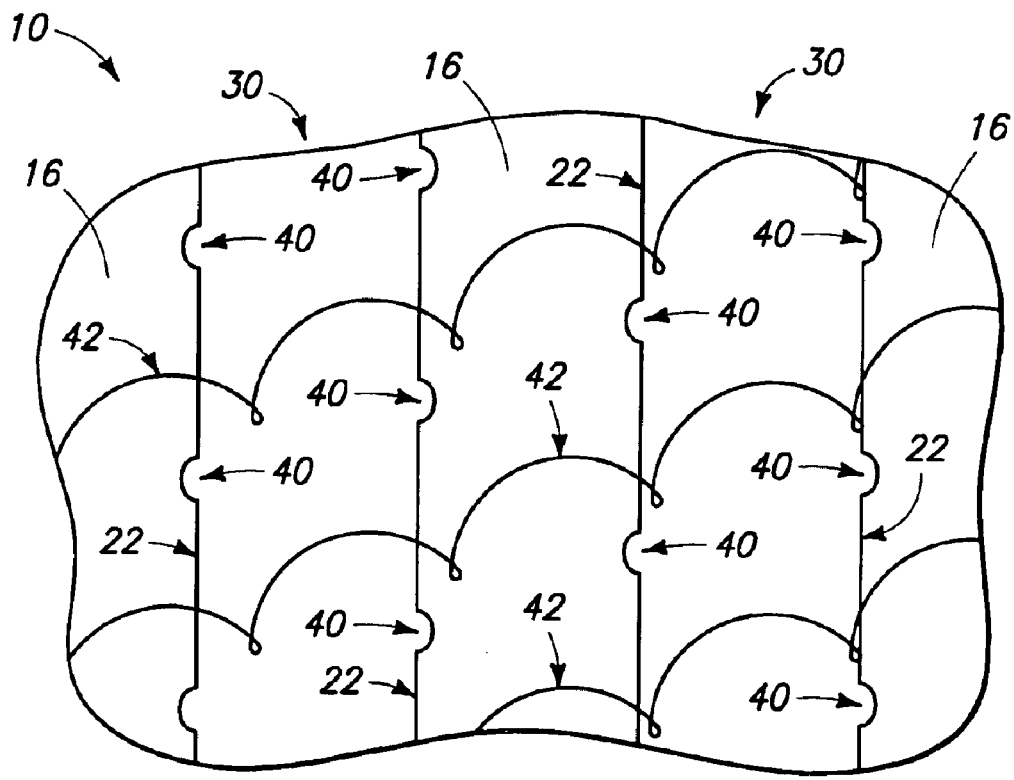
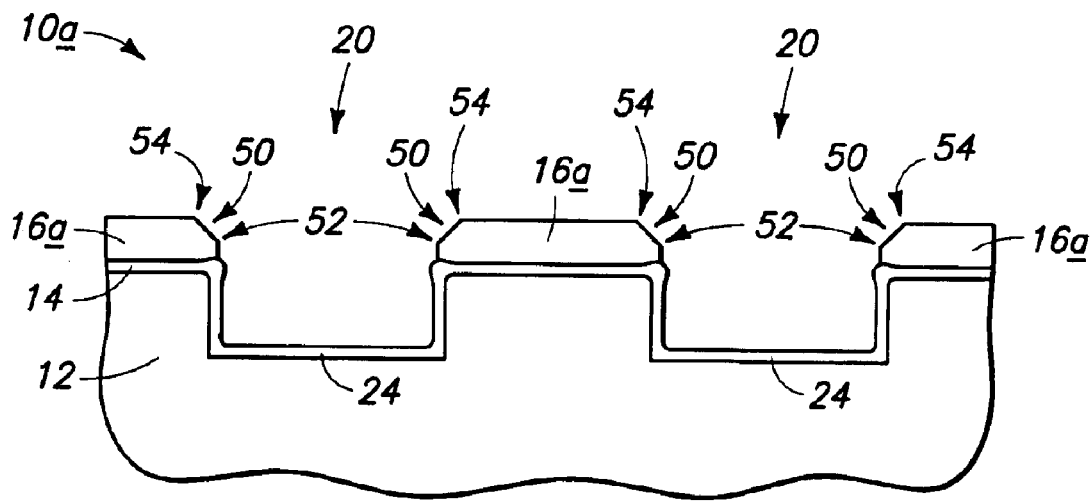
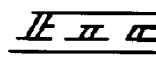

METHODS OF FORMING MATERIALS WITHIN OPENINGS, AND METHODS OF FORMING ISOLATION REGIONS

RELATED PATENT DATA

This application resulted from a Continuation of U.S. patent application Ser. No. 09/910,340, filed Jul. 20, 2001, now U.S. Pat. No. 6,420,268 B2, issued Jul. 16, 2002, which is a Continuation of patent application Ser. No. 09/146,730, filed on Sep. 3, 1998, now U.S. Pat. No. 6,274,498, issued Aug. 14, 2001, the disclosure of which is incorporated by reference.

TECHNICAL FIELD

The invention pertains to methods of forming materials within openings, such as, for example, methods of forming isolation regions.

BACKGROUND OF THE INVENTION

Planarization methods, such as, for example, chemical-mechanical polishing, are commonly used in semiconductor fabrication processes. An exemplary process which utilizes planarization methods is trench isolation region fabrication. Trench isolation regions generally comprise a trench or cavity formed within the substrate and filled with an insulative material, such as, for example, silicon dioxide. Trench isolation regions are commonly divided into three categories: shallow trenches (trenches less than about one micron deep); moderate depth trenches (trenches of about one to about three microns deep); and deep trenches (trenches greater than about three microns deep).

A prior art method for forming trench isolation regions is described with reference to FIGS. 1–9. Referring to FIG. 1, a semiconductor wafer fragment 10 is shown at a preliminary stage of the prior art processing sequence. Wafer fragment 10 comprises a semiconductive material 12 upon which is formed a layer of oxide 14, a layer of nitride 16, and a patterned layer of photoresist 18. Semiconductive material 12 commonly comprises monocrystalline silicon which is lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Oxide layer 14 typically comprises silicon dioxide, and nitride layer 16 typically comprises silicon nitride. Oxide layer 14 can consist essentially of silicon dioxide, and nitride layer 16 can consist essentially of silicon nitride. Nitride layer 16 is generally from about 400 Angstroms thick to about 1500 Angstroms thick.

Referring to FIG. 2, patterned photoresist layer 18 is used as a mask for an etching process. The etch is typically conducted utilizing dry plasma conditions and $CH_2F_2/CF_4$ chemistry. Such etching effectively etches both silicon nitride layer 16 and pad oxide layer 14 to form openings 20 extending therethrough. The etching stops upon reaching silicon substrate 12. The etching into nitride layer 16 defines upper corners 22 of the portions of the nitride layer remaining over substrate 12.

Referring to FIG. 3, a second etch is conducted to extend openings 20 into silicon substrate 12. The second etch is commonly referred to as a "trench initiation etch." The trench initiation etch is typically a timed dry plasma etch utilizing $CF_4$/HBr, and typically extends openings 20 to less than or equal to about 500 Angstroms into substrate 12.

Referring to FIG. 4, a third etch is conducted to extend openings 20 further into substrate 12 and thereby form trenches within substrate 12. The third etch typically utilizes an etchant consisting entirely of HBr, and is typically a timed etch. The timing of the etch is adjusted to form trenches within substrate 12 to a desired depth. For instance, if openings 20 are to be shallow trenches, the third etch will be timed to extend openings 20 to a depth of less than or equal to about one micron.

Referring to FIG. 5, photoresist layer 18 (FIG. 4) is removed and a first oxide fill layer 24 is thermally grown within openings 20.

Referring to FIG. 6, a high density plasma oxide 28 is formed to fill openings 20 (FIG. 5) and overlie nitride layer 16. High density plasma oxide 28 merges with oxide layer 24 (FIG. 5) to form oxide plugs 30 within openings 20 (FIG. 5).

Referring to FIG. 7, wafer fragment 10 is subjected to planarization (such as, for example, chemical-mechanical polishing) to planarize an upper surface of oxide plugs 30. The planarization utilizes a chemistry selective for the oxide material of layer 24 (FIG. 5) relative to the material of nitride layer 16. Accordingly, nitride layer 16 functions as an etch-stop, and the planarization stops at an upper surface of nitride layer 16.

Referring to FIG. 8, nitride layer 16 is removed to expose pad oxide layer 14 between oxide plugs 30. Subsequent processing (not shown) can then be conducted to form a polysilicon layer over and between oxide plugs 30, and to form transistor devices from the polysilicon layer. The regions between oxide plugs 30 are active regions for such transistor devices, and oxide plugs 30 are trench isolation regions separating the transistor devices.

A difficulty of the above-discussed prior art isolation-region-forming method is described with reference to FIG. 9, which illustrates a top view of wafer fragment 10 at the processing step shown in FIG. 7. Specifically, FIG. 9 illustrates a top view of wafer fragment 10 after a planarization process.

Planarization processes typically comprise polishing processes wherein an abrasive material is rubbed against a layer that is to be planarized. For example, chemical-mechanical polishing of oxide material 28 (FIG. 6) involves rubbing a grit-containing slurry against oxide material 28. The slurry is intended to form an interface between a polishing pad and wafer fragment 10 such that the pad does not physically contact portions of wafer fragment 10. However, if there exists particles in the slurry, shear thickening of the slurry, or contact of pad to substrate, then portions of the etch stopping layer, along with portions of the substrate, can be chipped away. This can result in defects which render the device to be made inoperable.

FIG. 9 illustrates that the planarization process has chipped corners 22 of nitride layers 16 to remove portions of the nitride layers and form divots 40. Some of the nitride chipped from corners 22 has become lodged between the polishing pad and wafer fragment 10 during the planarization process. The lodged nitride scratches nitride layers 16 and oxide material 30 as it is spun by the polishing pad to form spiral scratches 42 extending across nitride layer 16 and oxide material 30. Divots 40 and scratches 42 damage oxide regions 30 and can adversely impact further processing and utilization of wafer fragment 10. Accordingly, it would be desirable to develop methods which alleviate chipping of etch-stop layers during planarization processes.

SUMMARY OF THE INVENTION

In one aspect, the invention encompasses a method of forming a material within an opening. An etch-stop layer is formed over a substrate. The etch-stop layer has an opening extending therethrough to expose a portion of the underlying substrate and comprises an upper corner at a periphery of the opening. The upper corner has a corner angle with a first degree of sharpness. A portion of the upper corner is removed to reduce the sharpness of the corner angle to a second degree. After the portion of the upper corner is removed, a layer of material is formed within the opening and over the etch-stop layer. The material is planarized with a method selective for the material relative to the etch-stop layer to remove the material from over the etch-stop layer while leaving the material within the opening.

In another aspect, the invention encompasses a method of forming an isolation region. A nitride-containing layer is formed over a semiconductor substrate. An opening is formed to extend through the nitride-containing layer and into the underlying substrate. The nitride-containing layer comprises an upper corner at a periphery of the opening. The upper corner has a corner angle with a first degree of sharpness. A portion of the upper corner is removed to reduce the sharpness of the corner angle to a second degree. After the portion of the upper corner is removed, an insulative material is formed within the opening and over the nitride-containing layer. The insulative material is planarized to remove the material from over the nitride-containing layer while leaving the material within the opening in the semiconductive substrate. The material within the opening in the semiconductive substrate forms at least a portion of an isolation region.

BRIEF DESCRIPTION OF THE DRAWINGS

Preferred embodiments of the invention are described below with reference to the following accompanying drawings.

FIG. 9 shows a top view of the FIG. 1 wafer fragment at a prior art processing step identical to that shown in FIG. 7.

FIG. 10 is a diagrammatic, fragmentary, cross-sectional view of a semiconductor wafer fragment processed according to a first embodiment method of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment method of the present invention is described with reference to FIG. 10. In referring to FIG. 10, similar numbering to that utilized above in describing FIGS. 1–9 is used, with differences indicated by the suffix "a" or by different numerals.

Figure 5:
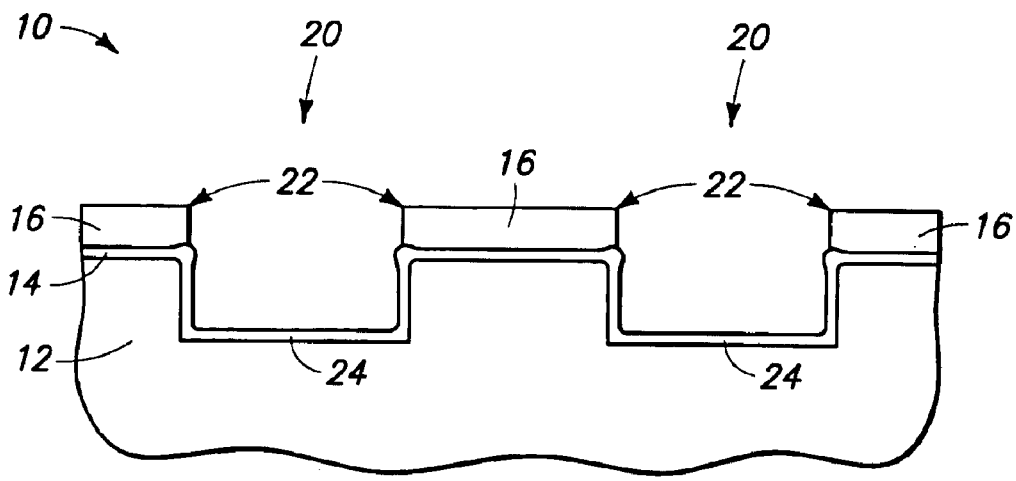
FIG. 5 shows the FIG. 1 wafer fragment at a prior art processing step subsequent to that of FIG. 4.

A semiconductor wafer fragment 10a is illustrated in FIG. 10 at a processing step subsequent to the prior art processing step illustrated in FIG. 5. Wafer fragment 10a comprises a substrate 12, a pad oxide layer 14, and an etch-stop layer 16 overlying oxide layer 14. Etch-stop layer 16a can comprise identical materials as etch-stop layer 16 of FIG. 5, such as, for example, silicon nitride. Wafer fragment 10a differs from the wafer fragment 10 of FIG. 5 in that nitride-containing etch-stop layer 16 (FIG. 5) has been subjected to a facet etch to reduce a sharpness of corners 22 (FIG. 5) and form etch-stop layer 16a of FIG. 5. Specifically, corners 22 of FIG. 5 have a first degree of sharpness (shown as about a 90° angle). In contrast, etch-stop layer 16a comprises a facet 50 in place of corner 22 (FIG. 5), and has effectively replaced corner 22 with a pair of corners 52 and 54. Each of corners 52 and 54 comprises an angle greater than the about 90° angle of corner 22 (FIG. 5). Accordingly, the facet-etching of the exemplary first embodiment processing has effectively removed a portion of upper corner 22 (FIG. 5) to reduce a sharpness of the corner angle from a first degree (here about 90°) to a second degree (which here comprises an angle of greater than 90°).

In embodiments wherein layer 16a comprises silicon nitride, the layer can be facet-etched by, for example, a plasma etch utilizing argon. An exemplary pressure to which wafer fragment 10a is subjected during flow of argon gas into the reaction chamber being from about 10 to about 100 standard cubic centimeters per minute, and with about 50 standard cubic centimeters per minute being typical. Power within the reaction chamber can be from about 100 watts to about 1,000 watts as a power at a top of the chamber, and from about 0 watts to about 1,000 watts as a power at a bottom of the chamber. A chuck temperature within the reaction chamber can float to about 400° C. The reaction chamber can be, for example, either a dual source plasma etcher or a single source plasma etcher.

The above-described conditions for facet etching are merely exemplary conditions, and persons of ordinary skill in the art will recognize that other conditions are known. However, regardless of the conditions utilized for the facet etching, it is preferable that a fluorine-containing compound (such as, for example, $CF_4$) be included during the plasma etching. Such fluorine-containing compound can volatilize nitride material during the facet etch such that the material will not otherwise deposit in openings 20.

It is noted that the facet etching can be conducted in a completely separate etch step from the step of removal of photoresist layer 18 (FIG. 4), or as a continuation of a photoresist stripping etch. Specifically, photoresist layer 18 can be removed by, for example, an etch utilizing gas mixtures including $O_2$, $CF_4$ and/or inert gas such as $N_2$ or Ar, which would also etch nitride layer 16a to form facets 50.

After the formation of facets 50, similar processing to that described above with reference to FIGS. 6–8 can be conducted to form a material (such as, for example, an oxide) over etch-stop layer 16 and within openings 20, and to planarize the material. The facet etching of nitride layer 16 (FIG. 5) reduces the possibility that corners of etch-stop layer 16 will be chipped during planarization (such as, for example, chemical-mechanical polishing) of the material from over etch-stop layer 16. Accordingly, the facet etching of the present invention can alleviate or eliminate the chipping and scratching problems of the prior art that were discussed above with reference to FIG. 9.

Figure 6:
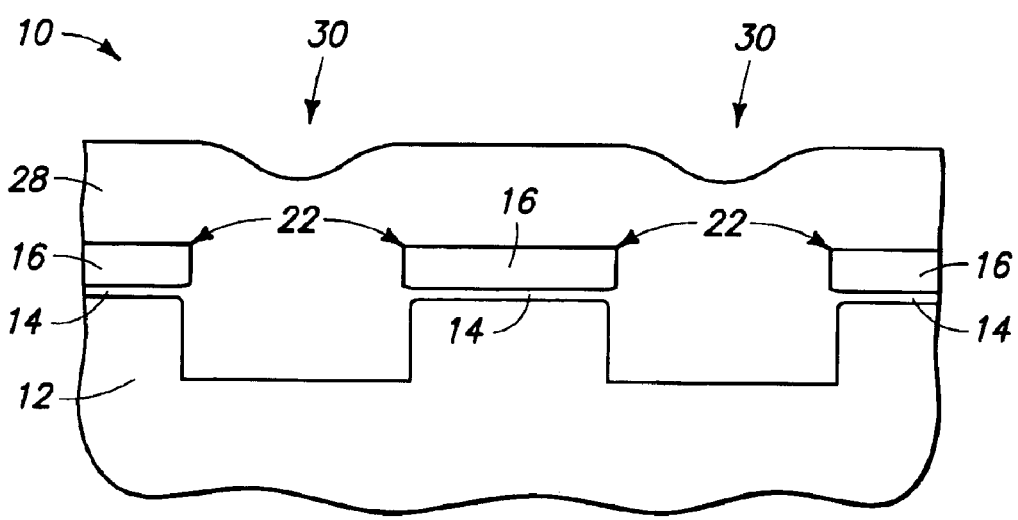
FIG. 6 shows the FIG. 1 wafer fragment at a prior art processing step subsequent to that of FIG. 5.
Figure 7:
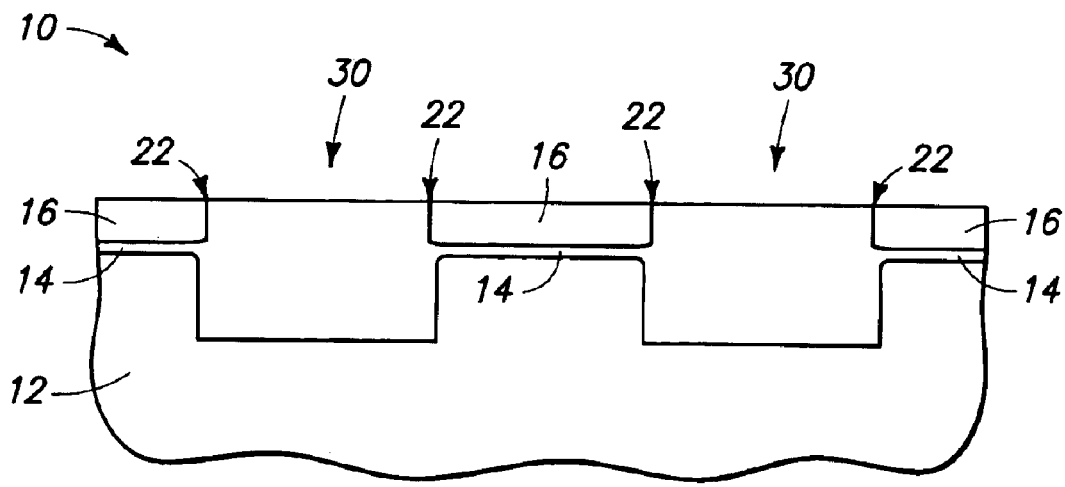
FIG. 7 shows the FIG. 1 wafer fragment at a prior art processing step subsequent to that of FIG. 6.
Figure 8:
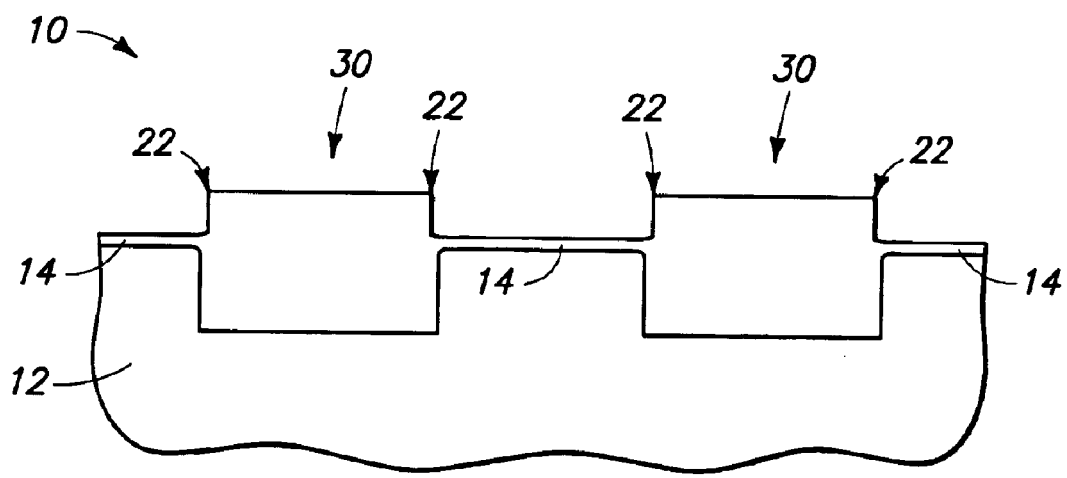
FIG. 8 shows the FIG. 1 wafer fragment at a prior art processing step subsequent to that of FIG. 7.

It is noted that the faceted edges of nitride layer 16a can lead to overhanging oxide ledges (not shown) of isolation oxide formed within openings 20 during application of the subsequent processing of FIGS. 6–8 to the structure of FIG. 10. Specifically, such overhanging oxide ledges can result after nitride layer 16a is removed in processing analogous to that described above with reference to FIG. 8. If such overhanging oxide ledges are formed, they are preferably removed prior to formation of transistor devices proximate the isolation oxide. The overhanging oxide ledges can be removed by, for example, chemical-mechanical polishing of the isolation oxide or appropriate wet chemical treatments.

A second embodiment of the present invention is described with reference to FIG. 11. In describing the embodiment of FIG. 11, similar numbering to that utilized above in describing prior art FIGS. 1–9 is used, with differences indicated by the suffix "b", or by different numerals.

Figure 11:
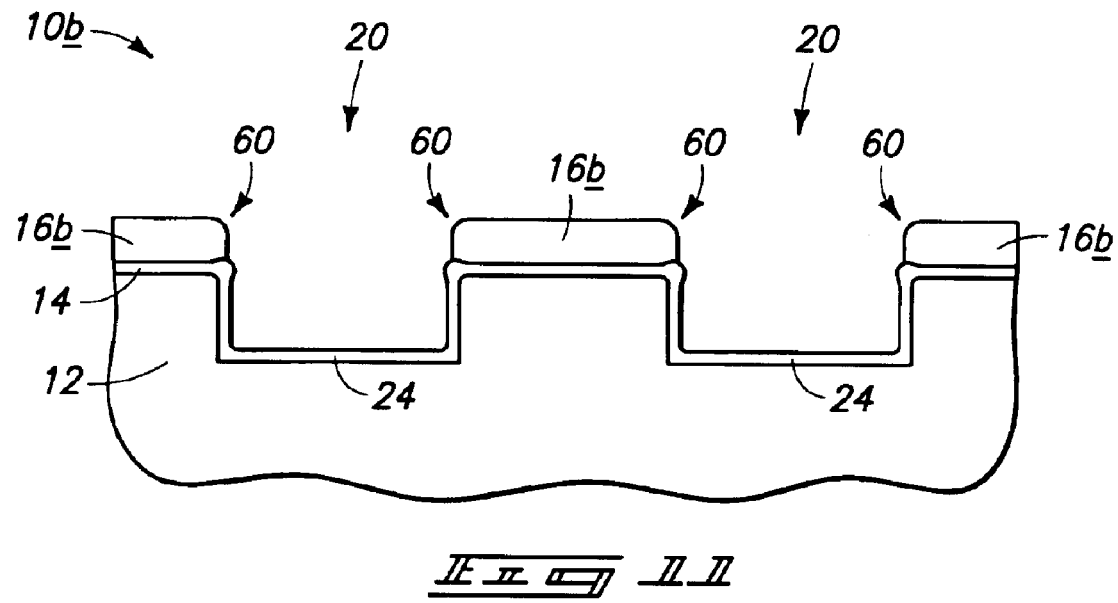
FIG. 11 is a diagrammatic, fragmentary, cross-sectional view of a semiconductor wafer fragment processed according to a second embodiment method of the present invention.

FIG. 11 illustrates a semiconductor wafer fragment 10b at a processing step subsequent to the prior art step illustrated in FIG. 5. Wafer fragment 10b comprises a substrate 12, a pad oxide layer 14, and an etch-stop layer 16b. Etch-stop layer 16b can comprise identical materials as etch-stop layer 16 of FIG. 5, such as, for example, silicon nitride. Wafer fragment 10b differs from wafer fragment 10 of FIG. 5 in that etch-stop layer 16 of FIG. 5 has been subjected to an anisotropic etch to round corners 22 (FIG. 5) and form rounded corners 60 of etch-stop layer 16b. The anisotropic etch can comprise, for example, an etch utilizing $CF_4/CHF_3$, a power of greater than 0 and less than about 1000 watts, a temperature of less than about 50° C., and a pressure of less than about 300 mTorr.

The anisotropic etching of layer 16b removes a portion of corner 22 (FIG. 5) to reduce a sharpness of the corner. In other words, the anisotropic etching reduces a corner angle of etch-stop layer 16 from a first degree of sharpness (corresponding to the sharpness of corner 22 of etch-stop layer 16 in FIG. 5) to a second degree of sharpness (corresponding to the rounded features of corners 60 etch-stop layer 16b of FIG. 11).

After the anisotropic etching to form rounded corners 60, wafer fragment 10b can be subjected to subsequent processing similar to that described above with reference to FIGS. 6–8 to form a material (such as, for example, silicon dioxide) within openings 20 and over etch-stop layer 16b, and to subsequently planarize the material down to an upper surface of etch-stop layer 16b. Etch-stop layer 16b can then be removed, and the material utilized for forming isolation regions between transistor devices.

It is noted that the rounded edges of nitride layer 16b can lead to overhanging oxide ledges (not shown) of isolation oxide formed during application of the subsequent processing of FIGS. 6–8 to the structure of FIG. 11. If such overhanging oxide ledges are formed, they are preferably removed prior to formation of transistor devices adjacent the isolation oxide. Such overhanging oxide ledges can be removed by, for example, chemical-mechanical polishing of the isolation oxide after removal of etch-stop layer 16b.

It is also noted that corners 22 (FIG. 5) can be rounded by etching processes other than the anisotropic etch described above. For instance, corners 22 can be rounded by exposing a nitride-containing layer 16 (FIG. 5) to a dip in hot phosphoric acid. Exemplary conditions for such hot phosphoric acid dip include a phosphoric acid solution having a concentration of about 86% (by weight), a temperature of the phosphoric acid of about 155° C., atmospheric pressure, and a dip time of from about 30 seconds to about 3 minutes.

A third embodiment of the present invention is discussed with reference to FIGS. 12–14. In describing the embodiment of FIGS. 12–14, similar numbering to that utilized above in describing the prior art processing of FIGS. 1–9 is used, with differences indicated by the suffix "c" or by different numbers.

Figure 1:
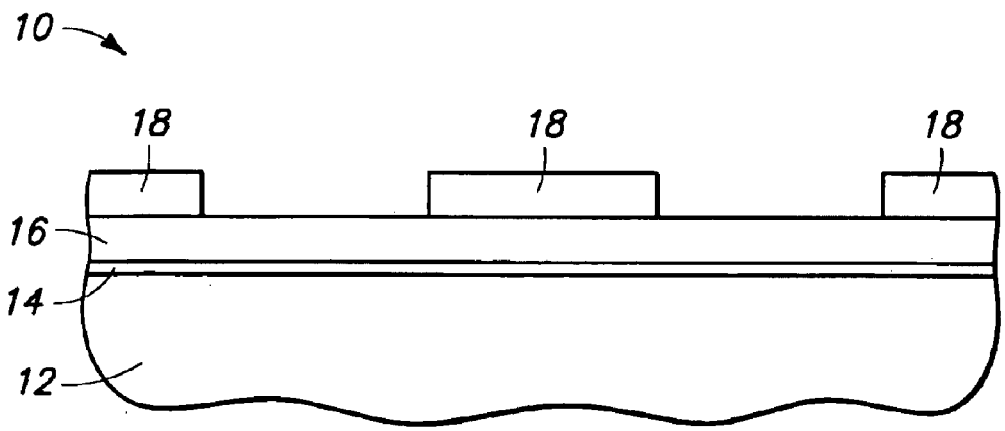
FIG. 1 is a diagrammatic, fragmentary, cross-sectional view of a semiconductor wafer fragment at a preliminary step of a prior art processing sequence.
Figure 2:
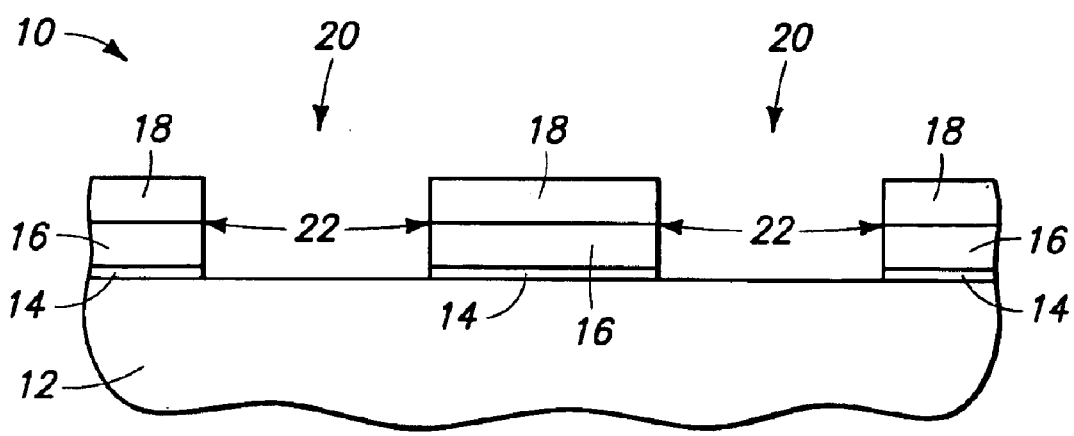
FIG. 2 shows the FIG. 1 wafer fragment at a prior art processing step subsequent to that of FIG. 1.
Figure 3:
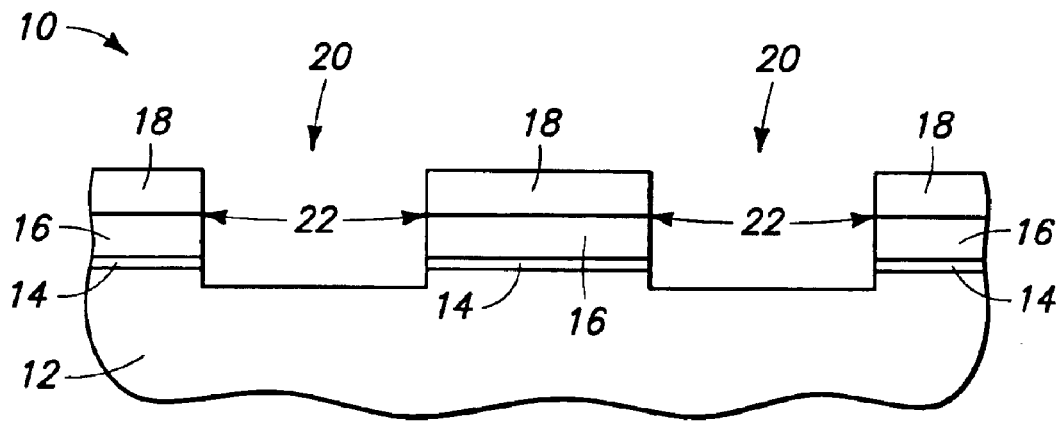
FIG. 3 shows the FIG. 1 wafer fragment at a prior art processing step subsequent to that of FIG. 2.
Figure 4:
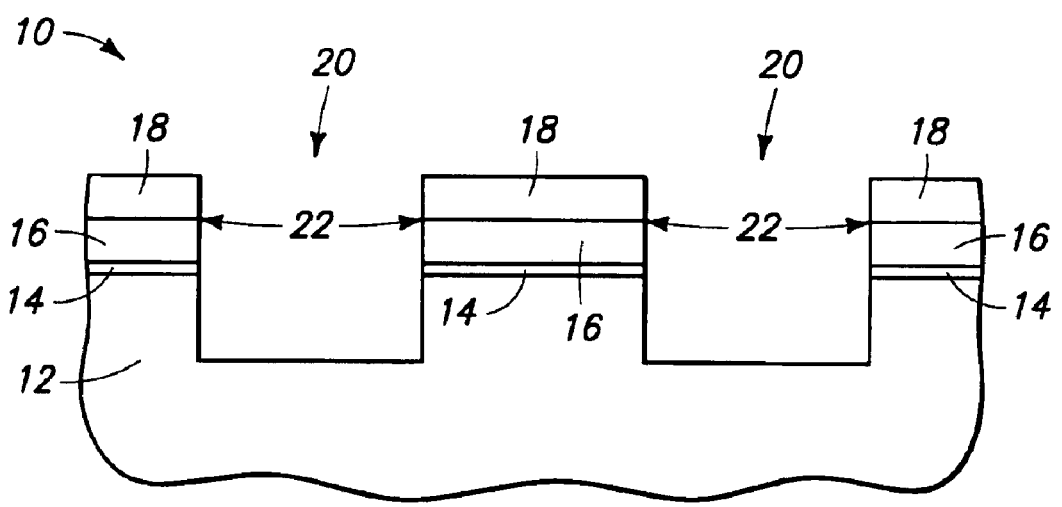
FIG. 4 shows the FIG. 1 wafer fragment at a prior art processing step subsequent to that of FIG. 3.
Figure 12:
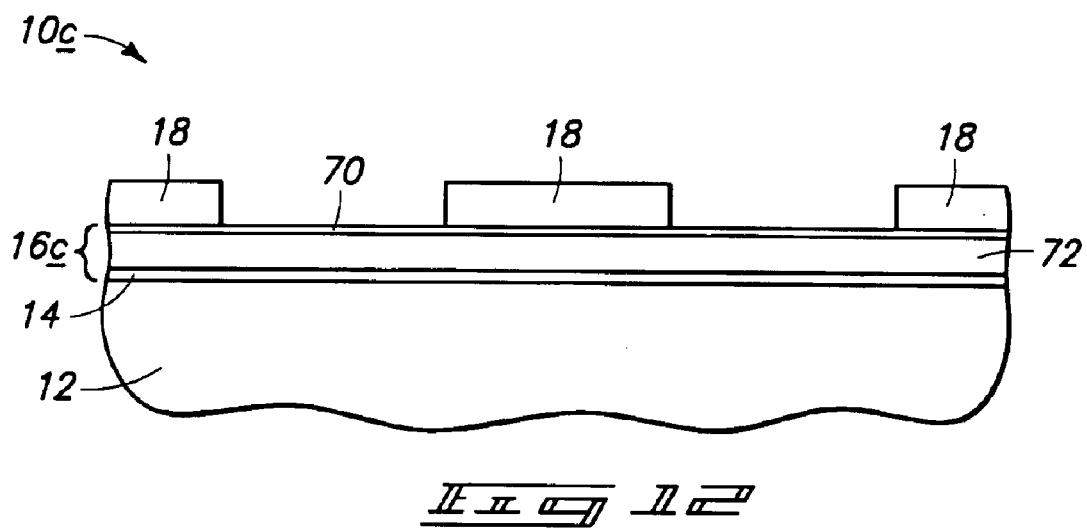
FIG. 12 is a diagrammatic, fragmentary, cross-sectional view of a semiconductor wafer fragment processed according to a third embodiment method of the present invention.
Figure 13:
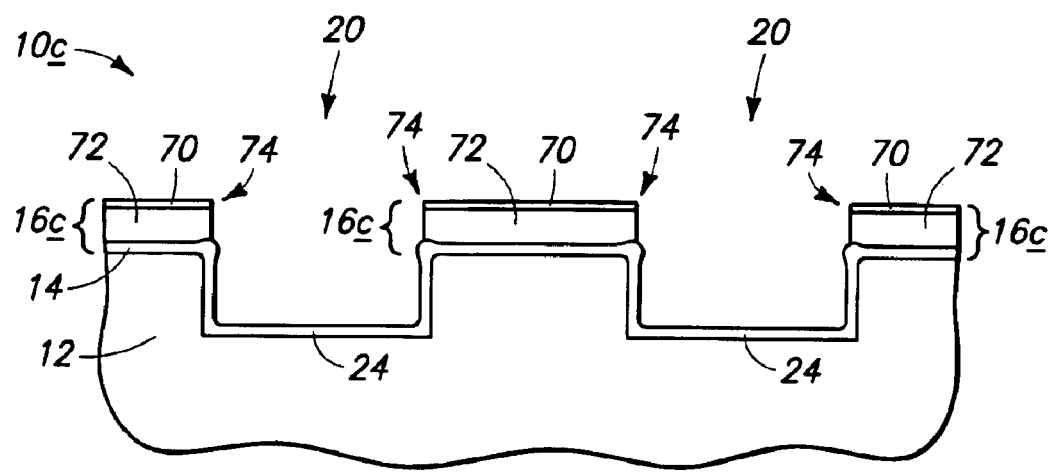
FIG. 13 shows the FIG. 12 wafer fragment at a processing step subsequent to that of FIG. 12.

FIG. 12 illustrates a semiconductor wafer fragment 10c at a processing step similar to the prior art processing step of FIG. 1. A difference between semiconductor wafer fragment 10c of FIG. 12 and wafer fragment 10 of FIG. 1 is that wafer fragment 10c comprises an etch-stop layer 16c having two distinct portions, whereas wafer fragment 10 comprises an etch-stop layer 16 containing only one portion. The two portions of etch-stop layer 16c are an upper portion 70 and a lower portion 72. Preferably, upper portion 70 has a faster etch rate when exposed to subsequent etching conditions than does lower portion 72. For example, in applications wherein etch-stop layer 16c comprises nitride, upper portion 70 can comprise $Si_xN_yO_z$, wherein x, y and z are greater than zero, and lower portion 72 can consist essentially of SiN. Upper portion 70 will then etch faster relative to lower portion 72 under subsequent etching conditions comprising exposing nitride-containing layer 16c to hydrofluoric acid.

A lower portion 72 consisting essentially of SiN can be formed by, for example, chemical vapor deposition utilizing $SiH_2Cl_2$ and $NH_3$. Upper portion 70 comprising $Si_xN_yO_z$ can then be formed by, for example, chemical vapor deposition utilizing $SiH_2Cl_2$, $NH_3$ and $N_2O$. Alternatively, upper portion $Si_xN_yO_z$ can be formed by oxidizing an upper surface of silicon nitride lower portion 72. Such oxidation can comprise, for example, rapid thermal processing at a temperature of from about 1,000° C. to about 1,100° C. in an oxidizing ambient (e.g., $O_2$, $NO_x$, $H_2O_2$, etc.) for a time of from about 30 seconds to about three minutes.

An exemplary process of forming lower portion 72 comprising SiN and upper portion 70 comprising $Si_xN_yO_z$ is as follows. Lower portion 72 is formed by chemical vapor deposition utilizing $SiH_2Cl_2$ and $NH_3$ as precursors, in a reaction chamber at a temperature of from about 650° C. to about 800° C., and at a pressure of from about 100 mTorr to about 500 mTorr. After a period of time sufficient to grow layer 72 to a suitable thickness, $N_2O$ is introduced into the reaction chamber as another precursor. The combination of $N_2O$, $SiH_2Cl_2$ and $NH_3$ precursors grows upper layer 70 comprising $Si_xN_yO_z$. Preferably, lower portion 72 of nitride layer 16c is formed to a thickness of from greater than 0 Angstroms to about 900 Angstroms, and upper portion 70 is formed to a thickness of from about 50 Angstroms to about 500 Angstroms.

A hydrofluoric acid etch of layer 16c is described with reference to FIGS. 13 and 14. Referring to FIG. 13, wafer fragment 12 is subjected to processing analogous to the processing described above with reference to FIGS. 2–5, to form openings 20 extending through etch-stop layer 16c and into substrate 12. Etch-stop layer 16c comprises upper corners 74 having a first degree of roughness.

Figure 14:
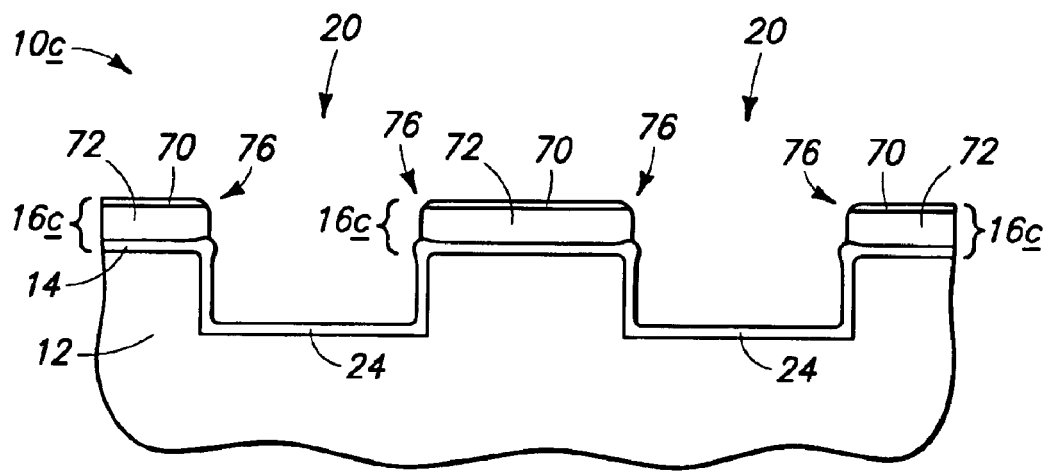
FIG. 14 shows the FIG. 12 wafer fragment at a processing step subsequent to that of FIG. 13.

Referring to FIG. 14, wafer fragment 10c is subjected to a dip in hydrofluoric acid solution which rounds corners 74 (FIG. 13) to form corners 76 having a second degree of sharpness which is less than the first degree of sharpness of corners 74.

In subsequent processing (not shown) wafer fragment 10c can be subjected to the processing of FIGS. 6–8 to form isolation regions analogous to isolation regions 30 of FIG. 8. Rounded corners 76 can avoid the prior art chipping and scratching problems discussed above with reference to FIG. 9.

As another example nitride layer 16c suitable for the third embodiment of the present invention, lower portion 72 can comprise silicon nitride comprising a first stoichiometric amount of silicon, and upper portion 72 can comprise silicon nitride comprising a second stoichiometric amount of silicon that is greater than the first stoichiometric amount of silicon. Upper portion 70 will then etch faster than lower portion 72 when nitride layer 16c is exposed to planarizing conditions, such as the conditions described above with reference to prior art FIG. 7. A method of forming such nitride layer 16c comprising a first stoichiometric amount of silicon in lower portion 72 and a second stoichiometric amount of silicon in upper portion 70 is as follows. A chemical vapor deposition (CVD) process is utilized with a silicon precursor gas (for example $SiH_2Cl_2$ (dichlorosilane)) and a nitrogen precursor gas (for example, $NH_3$ (ammonia)). A substrate is provided within a CVD reaction chamber, together with a first ratio of the silicon precursor gas to the nitrogen precursor gas. The first ratio of the silicon precursor gas to the nitrogen precursor gas can be about 0.33 to form a lower portion 72 having a stoichiometry of about $Si_3N_4$. Subsequently, the ratio of the silicon precursor gas to the nitrogen precursor gas is raised to, for example, about 6 to form a silicon enriched upper portion 72 of the silicon nitride layer. The silicon enriched upper portion has a stoichiometry of $Si_xN_y$, wherein the ratio of x to y is greater than or equal to 1. The silicon enriched upper portion can comprise, for example, $Si_4N_4$, $Si_7N_4$, $Si_{10}N_1$, or, if the flow of nitrogen precursor gas is effectively ceased, Si. Exemplary processing conditions for the CVD process can include a pressure of from about 100 mTorr to about 1 Torr, and a temperature of from about 700° C. to about 800° C.

Yet another method of forming etch-stop layer 16c of silicon nitride is to form lower portion 72 from silicon nitride utilizing chemical vapor deposition of $SiH_2Cl_2$ and $NH_3$ without a plasma, and to form upper portion 70 utilizing plasma enhanced chemical vapor deposition in the presence of an oxygen-containing precursor, $SiH_4$ and $NH_3$. Lower portion 72 can then consist essentially of silicon and nitrogen, and upper portion 70 can then comprise $Si_xN_yO_z$ wherein x, y and z are greater than 1. As discussed previously, such upper portion is more rapidly etched by a hydrofluoric acid etch than is such lower portion.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a material within an opening in a substrate, comprising:

providing a substrate;

forming an etch-stop layer over the substrate;

forming an opening extending through the etch-stop layer and into the substrate, the etch-stop layer comprising an upper corner at a first periphery portion of the opening and the substrate forming a second periphery portion of the opening;

forming an insulative layer over the second periphery portion of the opening, the insulative layer partially filling the opening and defining a third periphery portion of the opening within the substrate; and removing a portion of the upper corner of the etch-stop layer to form rounded corners of the etch-stop layer with the third periphery portion of the opening remaining essentially unchanged.

2. The method of claim 1 wherein the insulative layer comprises an oxide.

3. The method of claim 1 wherein the etch-stop layer comprises a nitride-containing material.

4. The method of claim 1 wherein the etch-stop layer comprises a silicon nitride.

5. The method of claim 1 wherein the removing the portion of the upper corner comprises anisotropically etching the etch-stop layer.

6. The method of claim 1 wherein the removing the portion of the upper corner comprises exposing the etch-stop layer to hot phosphoric acid.

7. The method of claim 1 wherein the insulative layer comprises silicon dioxide.

8. The method of claim 1 further comprising forming a layer of material within the opening and over the etch-stop layer, the layer filling the opening within the substrate.

9. A method of forming an opening in a substrate, comprising:

providing a substrate;

forming a pad oxide layer over the substrate;

forming an etch-stop layer over the pad oxide layer;

forming an opening extending through the etch-stop layer and pad oxide layer, the opening extending into the substrate, the etch-stop layer comprising an upper corner having a sharpness at a first periphery portion of the opening and the substrate comprising a corner at a second periphery portion of the opening; and reducing the sharpness of the upper corner of the etch-stop layer while leaving the corner of the substrate essentially unchanged.

10. The method of claim 9 wherein the reducing the sharpness of the upper corner comprises facet etching the upper corner.

11. The method of claim 9 wherein reducing the sharpness of the upper corner comprises facet etching the upper corner, the facet etching comprising exposing the etch-stop layer to a fluorine-containing compound.

12. The method of claim 9 wherein reducing the sharpness of the upper corner comprises anisotropically etching the etch-stop layer.

13. The method of claim 9 wherein the reducing the sharpness of the upper corner comprises exposing the etch-stop layer to hot phosphoric acid.

* * * * *

UNITED STATES PATENT AND TRADEMARK OFFICE
CERTIFICATE OF CORRECTION

PATENT NO. : 6,884,725 B2  Page 1 of 1
APPLICATION NO. : 10/145562
DATED : April 26, 2005
INVENTOR(S) : Moore et al.

It is certified that error appears in the above-identified patent and that said Letters Patent is hereby corrected as shown below:

Title Page 2, "US PATENT DOCUMENTS", Column 1, please insert --5,801,082 9/1998 Tseng-- before "5,801,083".

Col. 4, line 50 please insert --such plasma etch is from about 2m Torr to about 20m Torr. The etching typically takes place in a reaction chamber, with an exemplary rate of-- after "during".

Signed and Sealed this

Eleventh Day of July, 2006

JON W. DUDAS
*Director of the United States Patent and Trademark Office*